(12) United States Patent
Bernard et al.

(10) Patent No.: US 10,198,835 B2
(45) Date of Patent: Feb. 5, 2019

(54) CONTINUOUS RF SIGNAL VISUALIZATION WITH HIGH RESOLUTION

(71) Applicant: TEKTRONIX, INC., Beaverton, OR (US)

(72) Inventors: Kyle L. Bernard, Tigard, OR (US); Edward C. Gee, Camas, WA (US); David H. Eby, Aloha, OR (US); Julian B. Sessions, Aloha, OR (US); Steven W. Stanton, Aloha, OR (US); Robert E. Tracy, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 247 days.

(21) Appl. No.: 15/354,950

(22) Filed: Nov. 17, 2016

(65) Prior Publication Data

US 2017/0069119 A1    Mar. 9, 2017

Related U.S. Application Data

(62) Division of application No. 13/156,623, filed on Jun. 9, 2011, now abandoned.

(Continued)

(51) Int. Cl.
*G06T 11/20* (2006.01)
*G09G 5/39* (2006.01)
(Continued)

(52) U.S. Cl.
CPC .......... *G06T 11/206* (2013.01); *G01R 13/029* (2013.01); *G01R 13/0254* (2013.01);
(Continued)

(58) Field of Classification Search
CPC ......... G06T 11/206; G06T 3/40; G01R 23/16; G01R 23/18; G01R 13/0254;
(Continued)

(56) References Cited

U.S. PATENT DOCUMENTS 4,015,087 A * 3/1977 Stewart .................. G10L 15/00
324/76.22
4,583,190 A * 4/1986 Salb ....................... A61B 5/048
708/404

(Continued)

OTHER PUBLICATIONS

"Pistol 350 50 MHz Spectrum Analyzer," available at http://www.baesystems.com/ProductsServices/bae_prod_s2_pistol350.html, copyright © 2006-2011, accessed on Jul. 20, 2011.

(Continued)

*Primary Examiner* — Orlando Bousono
(74) *Attorney, Agent, or Firm* — Miller Nash Graham & Dunn

(57) ABSTRACT

A method and apparatus for continuous RF signal visualization with high resolution acquires RF signal data within a specified frequency bandwidth seamlessly to produce digitized time domain data. The digitized time domain data is processed in both the frequency and time domains to form high resolution spectral and time traces which are stored. To match human visualization abilities, the high resolution traces are combined to form low resolution traces which are displayed. With the spectral traces, spectrum bitmaps may be generated and stored so that the spectrum bitmap for any displayed spectral trace may be recalled and displayed. The high resolution traces for any specified low resolution trace may be recalled for display. Finally multiple trigger event types may be generated and displayed with the displayed traces.

11 Claims, 9 Drawing Sheets

Related U.S. Application Data

(60) Provisional application No. 61/492,729, filed on Jun. 2, 2011.

(51) Int. Cl.
| | | |
|---|---|---|
| *G01R 13/02* | (2006.01) | |
| *H04N 19/70* | (2014.01) | |
| *G06T 3/40* | (2006.01) | |
| *G09G 5/391* | (2006.01) | |
| *G09G 5/393* | (2006.01) | |
| *G09G 5/395* | (2006.01) | |
| *G09G 5/397* | (2006.01) | |

(52) U.S. Cl.
CPC ............... *G06T 3/40* (2013.01); *G09G 5/39* (2013.01); *H04N 19/70* (2014.11); *G09G 5/391* (2013.01); *G09G 5/393* (2013.01); *G09G 5/395* (2013.01); *G09G 5/397* (2013.01)

(58) Field of Classification Search
CPC ..... G01R 13/029; A61B 5/048; A61B 5/7257; H04N 19/70; G09G 5/39; G09G 5/391–5/397
See application file for complete search history.

(56) References Cited

U.S. PATENT DOCUMENTS

| | | | | |
|---|---|---|---|---|
| 4,636,876 A * | 1/1987 | Schwartz | ............... | G11B 20/10 360/32 |
| 4,682,248 A * | 7/1987 | Schwartz | ............... | G01V 1/247 360/32 |
| 4,736,307 A * | 4/1988 | Salb | ............ | A61B 5/048 128/920 |
| 4,755,889 A * | 7/1988 | Schwartz | ............... | G01V 1/247 360/32 |
| 4,870,348 A * | 9/1989 | Smith | ............ | G01R 13/408 324/76.19 |
| 4,950,999 A * | 8/1990 | Agnello | ............ | G01R 23/16 324/76.15 |
| 5,103,402 A | 4/1992 | Morton et al. | | |
| 5,162,723 A | 11/1992 | Marzalek et al. | | |
| 5,254,983 A | 10/1993 | Long et al. | | |
| 5,532,936 A * | 7/1996 | Perry | ............ | G10L 21/06 434/185 |
| 5,572,125 A | 11/1996 | Dunkel | | |
| 5,612,929 A * | 3/1997 | Lopes | ............ | G01S 7/6263 367/107 |
| 5,986,637 A | 11/1999 | Etheridge et al. | | |
| 6,233,529 B1 | 5/2001 | Nonaka | | |
| 6,251,077 B1 * | 6/2001 | Mo | ............ | A61B 8/06 600/455 |
| 6,681,191 B1 * | 1/2004 | Pickerd | ............ | G01R 13/345 702/120 |
| 7,292,164 B1 | 11/2007 | Wegener | | |
| 2002/0044600 A1 * | 4/2002 | Scheirer | ............ | H03M 7/30 375/240 |
| 2002/0067747 A1 | 6/2002 | Jalali et al. | | |
| 2005/0057253 A1 | 3/2005 | Gee et al. | | |
| 2005/0080828 A1 * | 4/2005 | Johnson | ............ | A61B 5/048 708/160 |
| 2005/0190974 A1 * | 9/2005 | Scheirer | ............ | H03M 7/30 382/232 |
| 2005/0234670 A1 * | 10/2005 | Hagen | ............ | G01R 13/206 702/85 |
| 2006/0176967 A1 | 8/2006 | Stanton et al. | | |
| 2006/0265213 A1 | 11/2006 | Bernard | | |
| 2007/0098045 A1 | 5/2007 | Cameron | | |
| 2007/0174021 A1 * | 7/2007 | Bernard | ............ | G01R 13/0254 702/182 |
| 2008/0052335 A1 | 2/2008 | Gee | | |
| 2008/0165355 A1 | 7/2008 | Yasui et al. | | |
| 2008/0258706 A1 * | 10/2008 | Bernard | ............ | G01R 23/16 324/76.22 |
| 2008/0260173 A1 * | 10/2008 | Dziubinski | ............ | A61B 5/0464 381/67 |
| 2008/0270440 A1 * | 10/2008 | He | ............ | G01R 23/16 |
| 2009/0085555 A1 * | 4/2009 | Heerema | ............ | G01R 23/18 324/76.27 |
| 2009/0094305 A1 * | 4/2009 | Johnson | ............ | A61B 5/048 708/403 |
| 2009/0153559 A1 | 6/2009 | Dees et al. | | |
| 2009/0290793 A1 | 11/2009 | Engholm et al. | | |
| 2009/0315889 A1 * | 12/2009 | Tognola | ............ | G06K 9/00523 345/440 |
| 2010/0153044 A1 * | 6/2010 | Nara | ............ | G01R 13/0236 702/76 |
| 2010/0231398 A1 * | 9/2010 | Engholm | ............ | G01R 23/16 340/658 |
| 2010/0235124 A1 * | 9/2010 | Tracy | ............ | G01R 13/0263 702/76 |
| 2010/0272166 A1 * | 10/2010 | Nara | ............ | G01R 23/165 375/224 |
| 2011/0280489 A1 * | 11/2011 | Turpin | ............ | G01R 13/0254 382/209 |
| 2012/0038369 A1 * | 2/2012 | Dobyns | ............ | G01R 13/0218 324/617 |
| 2012/0148126 A1 * | 6/2012 | Farr | ............ | A61B 5/055 382/128 |

OTHER PUBLICATIONS

"500-MHz wideband spectrum analyzer," available at http://www.baesystems.com/BAEProd/groups/public/@business/@eandis/documents/bae_publication/bae_pdf_500mhz_spec_analyzer.pdf, © 2010, accessed on Jul. 20, 2011.

"R&S®FSVR Real-Time Spectrum Analyzer" available at http://www2.rohde-schwarz.com/en/products/test_and_measurement/spectrum_analysis/FSVR.html, ©2011, accessed on Jul. 20, 2011.

"R&S®FSVR Real-Time Spectrum Analyzer: Discover the unseen" Product Brochure 02.00, dated Nov. 20, 2010, available at http://www2.rohde-schwarz.com/file_14435/FSVR_bro_en.pdf, accessed on Jul. 20, 2011.

Real-time Spectrum Analyzer Provides Seamless Signal Capture, Jul. 11, 2010, Microwave Journal http://www.microwavejournal.com/articles/9766-real-time-spectrum-analyzer-provides-seamless-signal-capture.

\* cited by examiner

CONTINUOUS RF SIGNAL VISUALIZATION WITH HIGH RESOLUTION

CROSS-REFERENCE TO RELATED APPLICATIONS

This application is a division of U.S. Non-Provisional patent application Ser. No. 13/156,623 titled "CONTINUOUS RF SIGNAL VISUALIZATION WITH HIGH RESOLUTION," filed Jun. 9, 2011, and claims the benefit of U.S. Provisional Patent Application No. 61/492,729 titled "CONTINUOUS RF SIGNAL VISUALIZATION WITH HIGH RESOLUTION" filed on Jun. 2, 2011, the contents of both of which are incorporated herein by reference in their entirety.

BACKGROUND OF THE INVENTION

The present invention relates to signal analysis, and more particularly to a method and apparatus for continuous RF signal visualization with high resolution using realtime frequency and time domain displays.

Modern realtime signal analyzers, such as spectrum analyzers and digital oscilloscopes, are capable of acquiring radio frequency (RF) signals at a rate that is too fast for effective realtime display. Current technology takes two basic approaches to addressing this mismatch between realtime signal acquisition and non-realtime signal display. One approach for spectrum analyzers is described in U.S. Pat. No. 5,103,402 entitled "Method and Apparatus for Identifying, Saving and Analyzing Continuous Frequency Domain Data in a Spectrum Analyzer", issued Apr. 7, 1992 to Steven R. Morton et al. This approach provides for realtime signal acquisition with high signal time resolution, but only a "leisurely", non-realtime signal display.

A second approach for oscilloscopes is described in U.S. Pat. No. 5,254,983 entitled "Digitally Synthesized Gray Scale for Raster Scan Oscilloscope Displays", issued Oct. 19, 1993 to David W. Long et al, and U.S. Pat. No. 5,986,637 entitled "Digital Oscilloscope Architecture for Signal Monitoring with Enhanced Duty Cycle", issued Nov. 16, 1999 to Eric P. Etheridge et al. The second approach addresses the realtime signal display problem by means of data reduction. However these data reduction methods are lossy in the sense that they sacrifice time resolution of the signal for more effective signal visualization. Thus this approach is not appropriate for realtime spectrum analysis.

The '402 patent, referenced above, produced a new three-dimensional (3D) visualization display for RF signals in the frequency domain, commonly called a "spectrogram." In spectrogram displays time is displayed along a vertical axis, frequency is displayed along a horizontal axis, and power is displayed as a color code. Each spectrum as acquired is displayed as a horizontal trace across the frequency spectrum, with the color of each point along the trace indicating the power of the RF signal at that frequency. The spectrogram display may be displayed in conjunction with a bit map display having a number of the most recently acquired spectrum, as shown in FIG. 1. However each spectrogram trace is displayed in non-realtime, i. e., with time gaps between displayed traces, as indicated above.

What is desired is a realtime signal display for continuous visualization of an RF signal in both the frequency and time domains while maintaining high resolution.

BRIEF SUMMARY

Accordingly, the present invention provides a method and apparatus for continuous RF signal visualization with high resolution using realtime frequency and time domain displays. RF signal data is acquired continuously from a specified realtime bandwidth within the frequency spectrum as down-converted, time domain, digital data. The digital data may then be processed in both the frequency and time domains to produce data traces for display as spectrograms and timeograms respectively. Each acquired data trace is time-stamped at a high rate and stored as seamless, i.e., without a time gap, high resolution data traces. However data traces are combined for display as low resolution data traces to meet human visualization update rate capabilities. A trigger circuit produces multiple trigger signals from the digital data in both the frequency and time domains, which trigger signals may be labeled and displayed with the spectrograms and/or timeograms to indicate when the particular trigger event occurred. One or some combination of the trigger signals may be selected by a user as a freeze trigger signal to stop acquisition of data traces so that the acquired data traces may be subjected to review. When the acquisition of data traces is frozen, the user may view the high resolution data traces from storage which were combined to make up the low resolution data traces, either as bitmap images or spectrograms/timeograms. Additionally for the data traces in the frequency domain, i.e., spectral traces, the associated conventional spectrum frequency versus amplitude data for each spectral trace may be time-stamped and stored so that when one of the spectral traces is selected during data review, the associated conventional spectrum bitmap may also be displayed.

The advantages and other novel features of the present invention are apparent from the following detailed description when read in conjunction with the attached drawing figures and appended claims.

DETAILED DESCRIPTION

Figure 2:
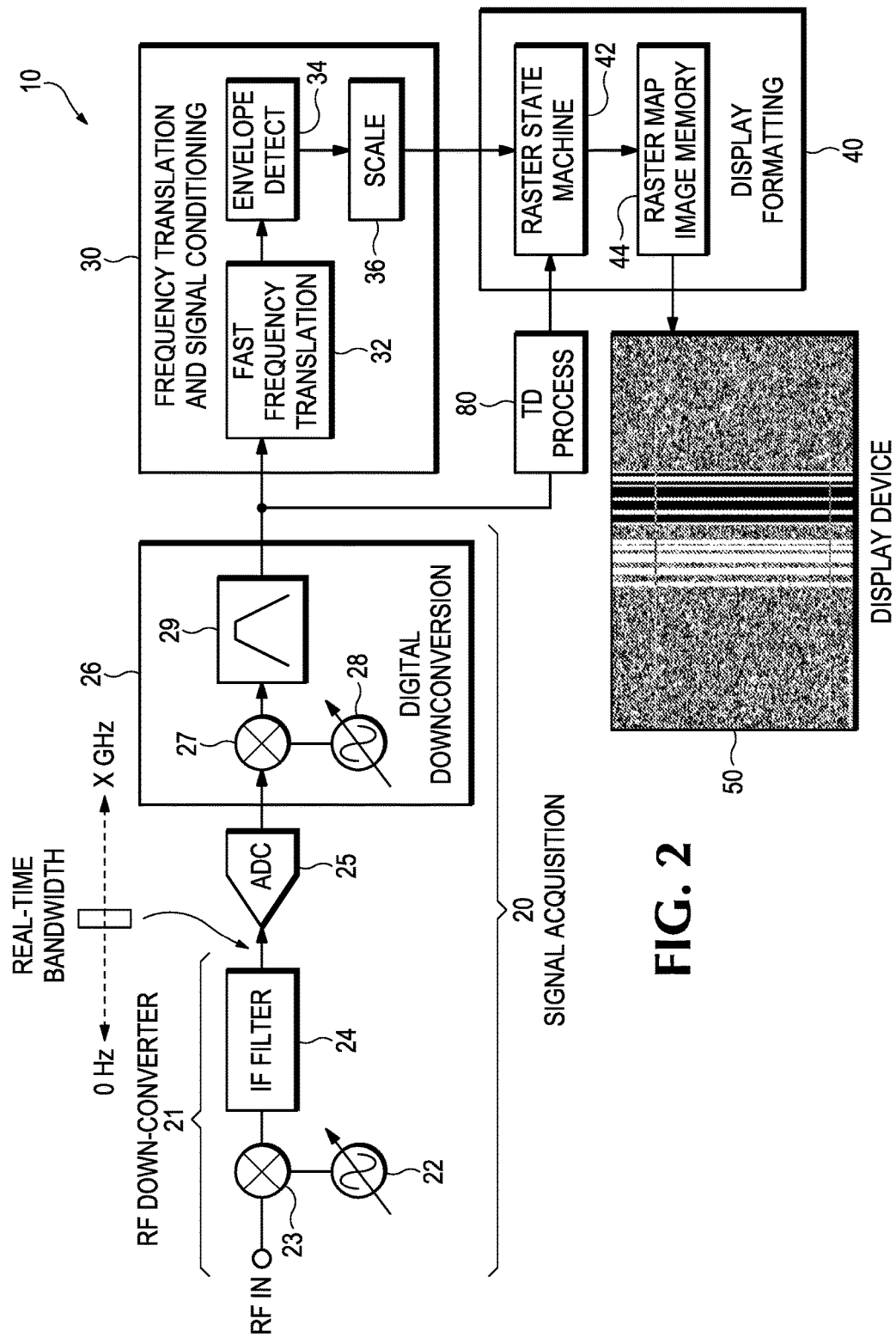
FIG. 2 is a block diagram view of an apparatus for real-time visualization of RF signals with high resolution according to the present invention.

Referring now to FIG. 2 an apparatus 10 is shown having a signal acquisition section 20 that has an RF signal as an input and digital time domain data as an output. The digital time domain data is input to a frequency translation and signal conditioning section 30 to produce frequency domain data. The digital time domain data also is input to a time domain processing section 80 to produce time domain data. The frequency and time domain data are input to a display formatting section 40 to produce a desired raster map image for visualization by a user on a display device 50. The keys to realtime displays for high resolution visualization of the input RF signal are fast signal acquisition and processing, and also separation of data acquisition and data review modes. In data acquisition mode, high resolution data traces are generated from the frequency and time domain data and stored, while being combined to form low resolution data traces which are displayed at a rate compatible with human visualization. In data review mode, acquisition of high resolution data traces is frozen, and the corresponding high resolution data traces from storage are then displayed.

The signal acquisition section 20 shown in FIG. 2 includes an RF down-converter 21 having an internal variable frequency oscillator 22 and a mixer 23. The RF signal and the variable frequency from the oscillator 22 are input to the mixer 23, the output of which is a first intermediate frequency (IF) signal that is input to an IF filter 24. The output from the IF filter 24 is digitized by an analog-to-digital converter (ADC) 25 to produce a digitized signal, and the digitized signal is input to a digital down converter 26 having digital mixer 27 for mixing the digitized signal with another variable frequency from a second variable oscillator 28. The output from the digital mixer 27 is input to a bandpass filter 29 to produce a frequency down-converted digital signal in the time domain, i.e., the digitized time domain data, for input to the frequency translation and signal conditioning section 30 and to the time domain processing section 80. The signal acquisition section 20 is typical of a realtime spectrum analyzer that is capable of acquiring seamless blocks of RF signal data and can support operation in which no data is missed or lost within a realtime bandwidth of the frequency spectrum that encompasses the RF signal.

There are several key blocks in the frequency translation, display formatting and time domain processing sections 30, 40, 80. The frequency translation and signal conditioning section 30 converts the digitized time domain data from the signal acquisition section 20 to frequency domain data. This is accomplished through a fast frequency translation process 32 using a variety of well-known transforms, including fast Fourier transforms (FFT) and chirp z-transform (CZT), which produce a single spectrum (spectral lines representing a plurality of frequency bins), or spectral data trace, from a time block of the digitized time domain data. An envelope detector 34 determines the signal amplitude for the frequency domain spectrum (an amplitude for each spectral line or frequency bin within the spectrum) from the fast frequency translation process 32. The amplitude versus frequency spectral data is then optionally passed through a display scaling function 36, which may be a logarithmic calculation to convert to a conventionally employed logarithmic amplitude display used by spectrum analyzers. Various other types of display scaling may be used, such as square-law or linear scaling. For implementation purposes each spectral trace may be represented as an amplitude vector in which each frequency bin is an n-bit number representing the detected signal amplitude. For realtime spectrogram displays each spectral data trace is calculated at a rate equivalent to the seamless acquisition system so that no signal information is lost.

Figure 1:
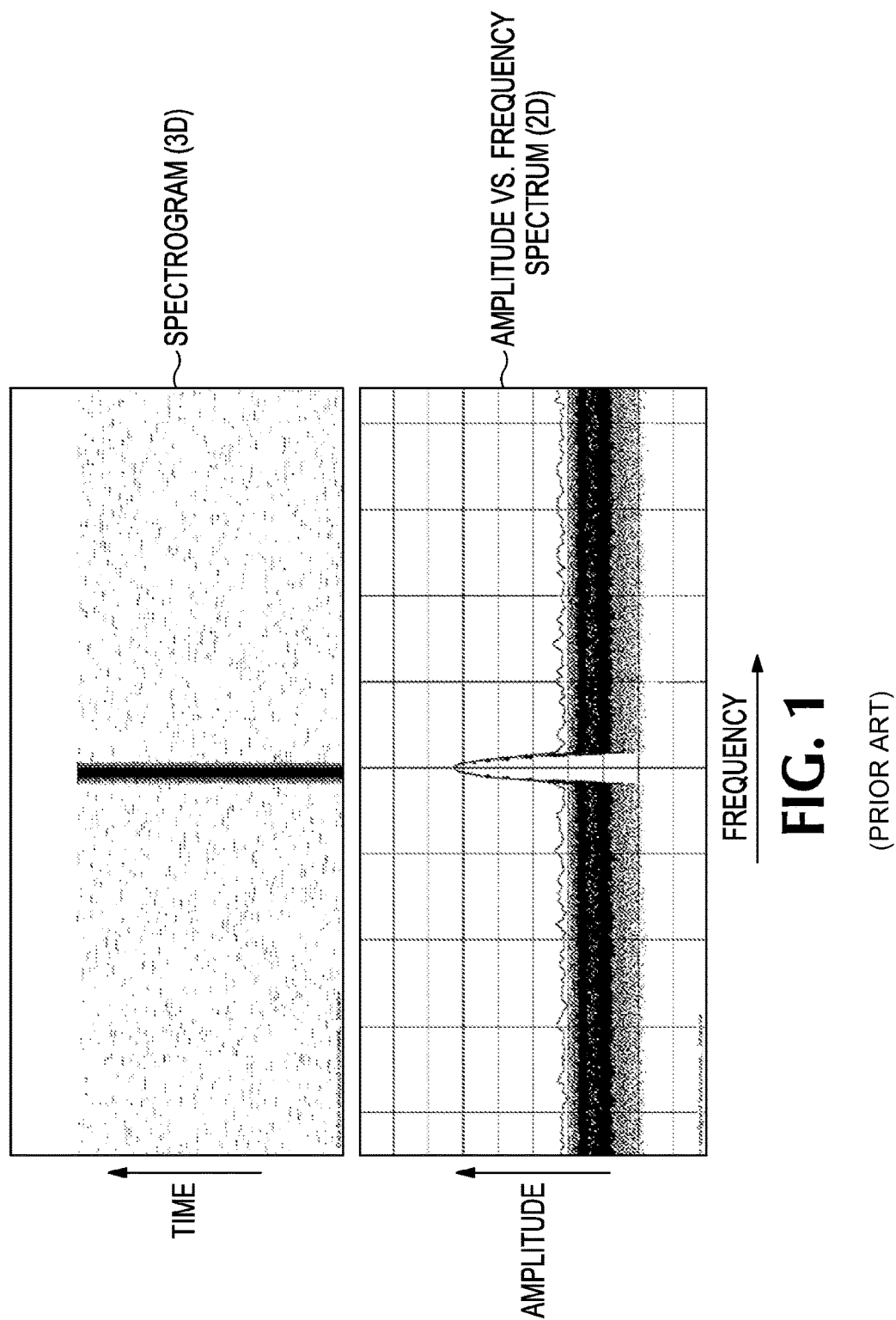
FIG. 1 is a plan view of a display of a spectrogram in conjunction with a spectrum bitmap.
Figure 3:
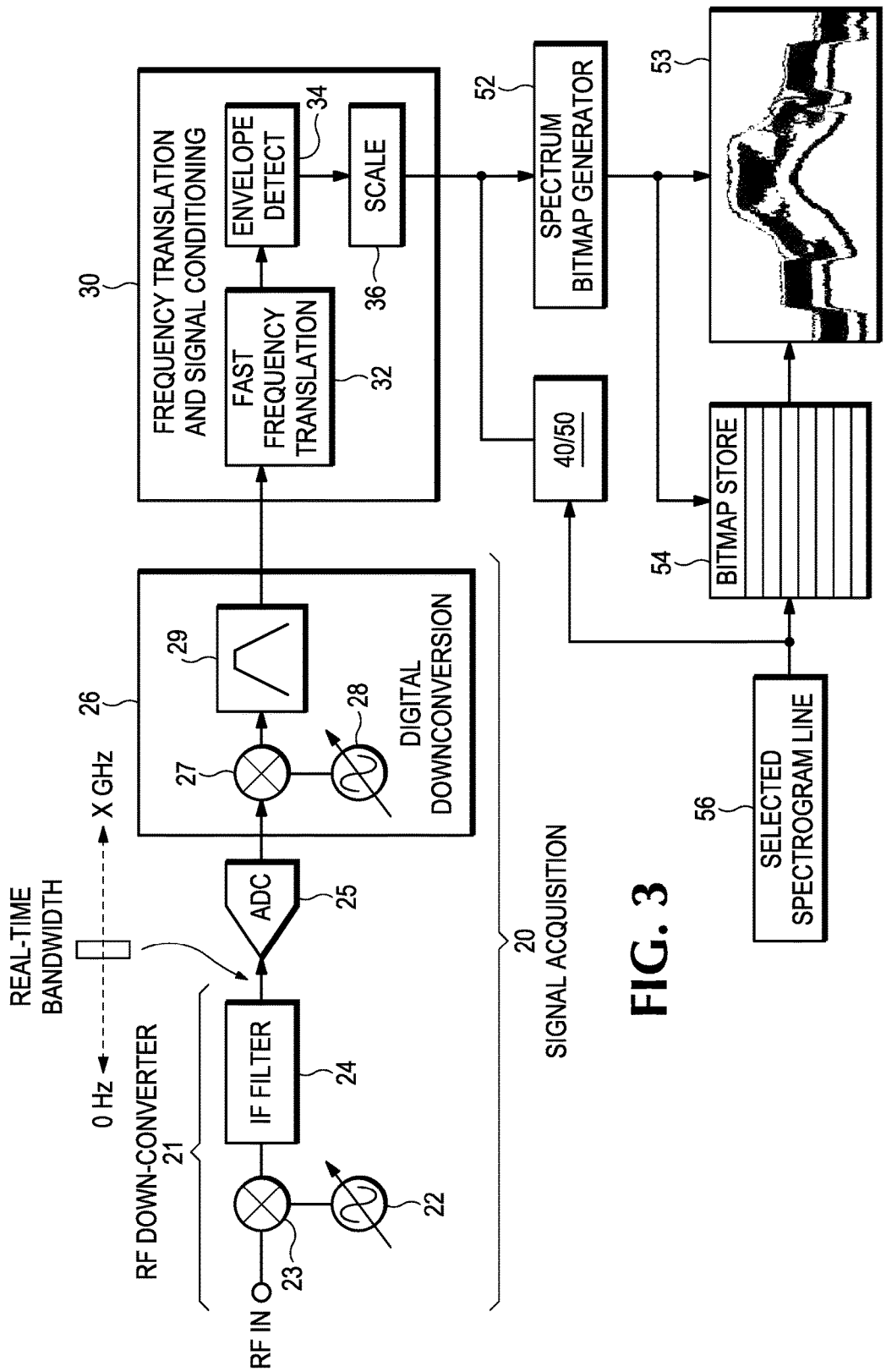
FIG. 3 is a block diagram view of a second embodiment of the apparatus of FIG. 2 including spectrum bitmap generation according to the present invention.

Referring now to FIG. 3, the spectral traces output from the frequency translation and signal conditioning module 30 may be input to a spectrum bit map generator 52 to produce conventional spectrum bit map displays 53 which are also time-stamped and stored in a spectrum bitmap store 54. A conventional user interface (U/I) 56 may be used in a data review mode, i.e., when acquisition is terminated either arbitrarily by a user or in response to a specific trigger signal, to select high resolution spectral traces to be shown on the display device 50. Then the corresponding bitmap from the spectrum bitmap store 54 may be displayed as the spectrum bitmap display 53 on the display device 50 together with the spectrogram display, as in FIG. 1.

Figure 4:
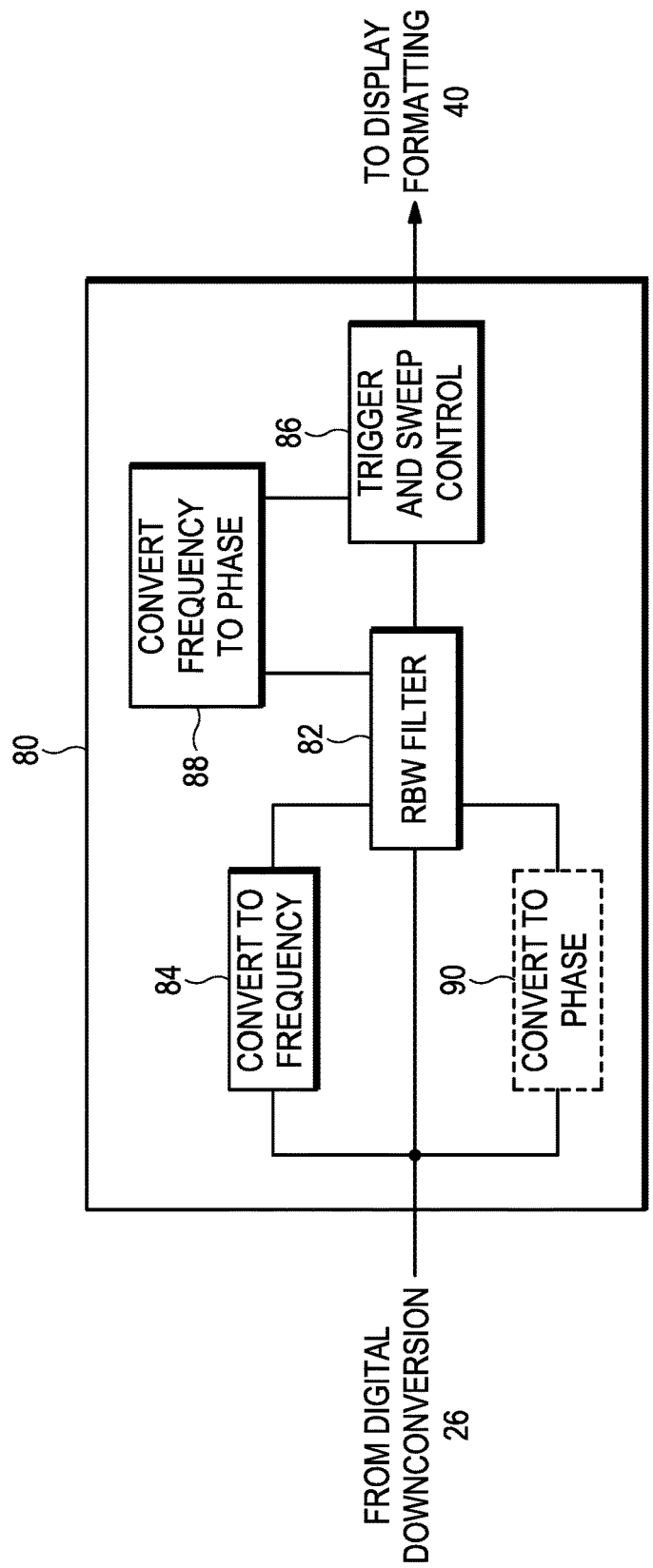
FIG. 4 is a partial block diagram of a time domain processor for use in conjunction with the apparatus of FIG. 1 to produce timeogram displays according to the present invention.

FIG. 4 shows the time domain processing section for the processing of the digitized time domain data prior to input to the display formatting section 40. The time domain data from the digital down-conversion section 26 may be input directly to a realtime bandwidth filter 82 or to a frequency conversion section 84 prior to input to the realtime bandwidth filter. The output from the realtime bandwidth filter 82 may be input either directly to a trigger and sweep control section 86 or indirectly via a frequency-to-phase conversion section 88. The output from the trigger and sweep control section 86 is time domain data that represent either amplitude, frequency or phase versus time according to the signal path selected by the user. The time domain data is then input to the display formatting section 40. Alternatively the frequency-to-phase conversion section 88 may be omitted and replaced by a phase conversion section 90 at the input of the realtime bandwidth filter 82.

As shown in FIG. 2, a raster state machine 42 processes both the time domain data and the frequency domain data to produce bitmap displays which are stored in a raster map image memory 44. The raster state machine 42 converts the frequency domain data received from the frequency translation and signal conditioning section 30 into a spectrogram display by mapping the amplitude values for each frequency bin into n-bit color values and "stacking" the color coded spectra in the raster map image memory 44. The color mapping alternatively may be performed by the display device 50 or a display processor as part of the display device based on spectral amplitude vectors in the raster map image memory 44. The raster state machine 42 performs this mapping in real time for each received spectral data trace until a complete display frame is generated. The display frame holds up to the total number of spectral data traces that can be held by the raster map image memory 44 and shown on the display device 50. At each display frame time, the raster image is rendered by the display device for human visualization. Although described with respect to a spectrogram display, the raster image may be in the form of spectrum bitmaps, a spectrogram, a waveform bitmap or a timeogram using similar processing by the raster state machine 42.

The human visual recognition system responds at a rate much slower than the rate of modern, digital RF signal behavior. So in order to provide realtime display update rates for good signal visualization, a method is needed by which the total displayed signal interval is extended to more closely match the human recognition capabilities. At the same time, in order to achieve good displayed signal resolution in the frequency domain, lossy data reduction methods, commonly used to extend time as described in the above-discussed U.S. Pat. Nos. 5,254,983 and 5,986,637, need to be avoided. To accomplish simultaneous signal visualization and high signal resolution, relatively low resolution data traces and a slower scrolling display are created for visualization while high resolution data traces are acquired and stored in a high resolution data trace store.

Figure 5:
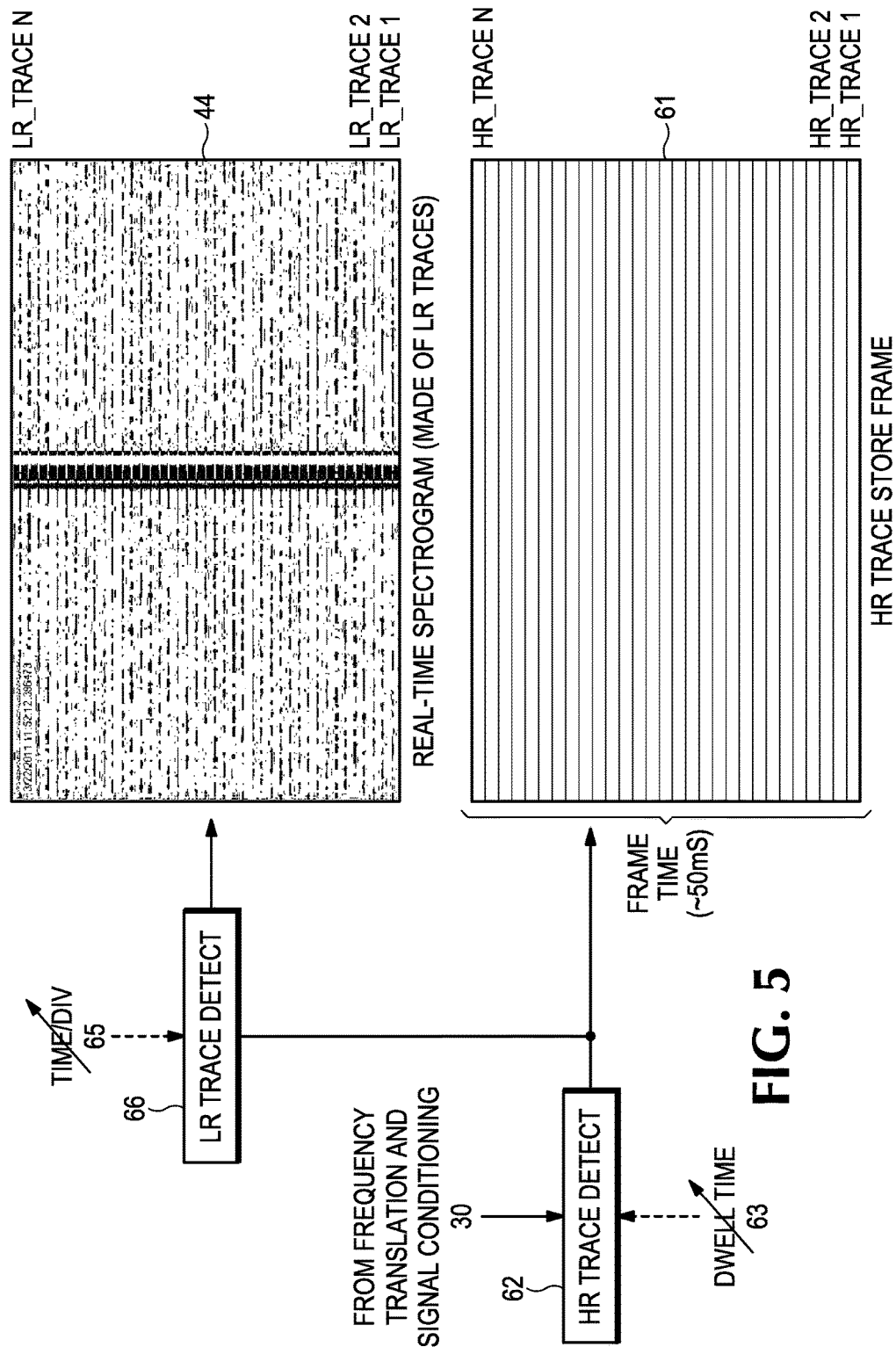
FIG. 5 is a partial block diagram view with accompanying displays for providing low resolution spectral traces while storing high resolution spectral traces according to the present invention.

FIG. 5 illustrates operation of the raster state machine 42 in producing low resolution data traces for the raster map image memory 44 while storing high resolution data traces in a high resolution data trace store 61. The frequency domain data from the frequency translation and signal conditioning module 30 are input to a high resolution trace detect module 62 as part of the raster state machine 42. The time block of frequency domain data that is used to produce the high resolution spectral trace is determined by a dwell time control 63. During realtime signal acquisition, acquisition traces are collected over fixed time intervals called "display frames." The high resolution traces are stored in the HR trace store frame 61 and also input to a low resolution trace detect module 66. A variety of detection methods may used, including peak, average, minimum, etc. Dwell time may range from a few microseconds to minutes or hours. The number of high resolution traces that are combined to form each low resolution trace is determined by the time/division control 65 and each low resolution trace is stacked in the raster image memory 44 to produce the display frame. The generation of the low resolution traces results in increased total display signal interval, but with reduced time resolution due to the combining of high resolution spectral traces. The total signal time contained in the raster map image memory 44 is user configurable by the time/division control 65.

Figure 6:
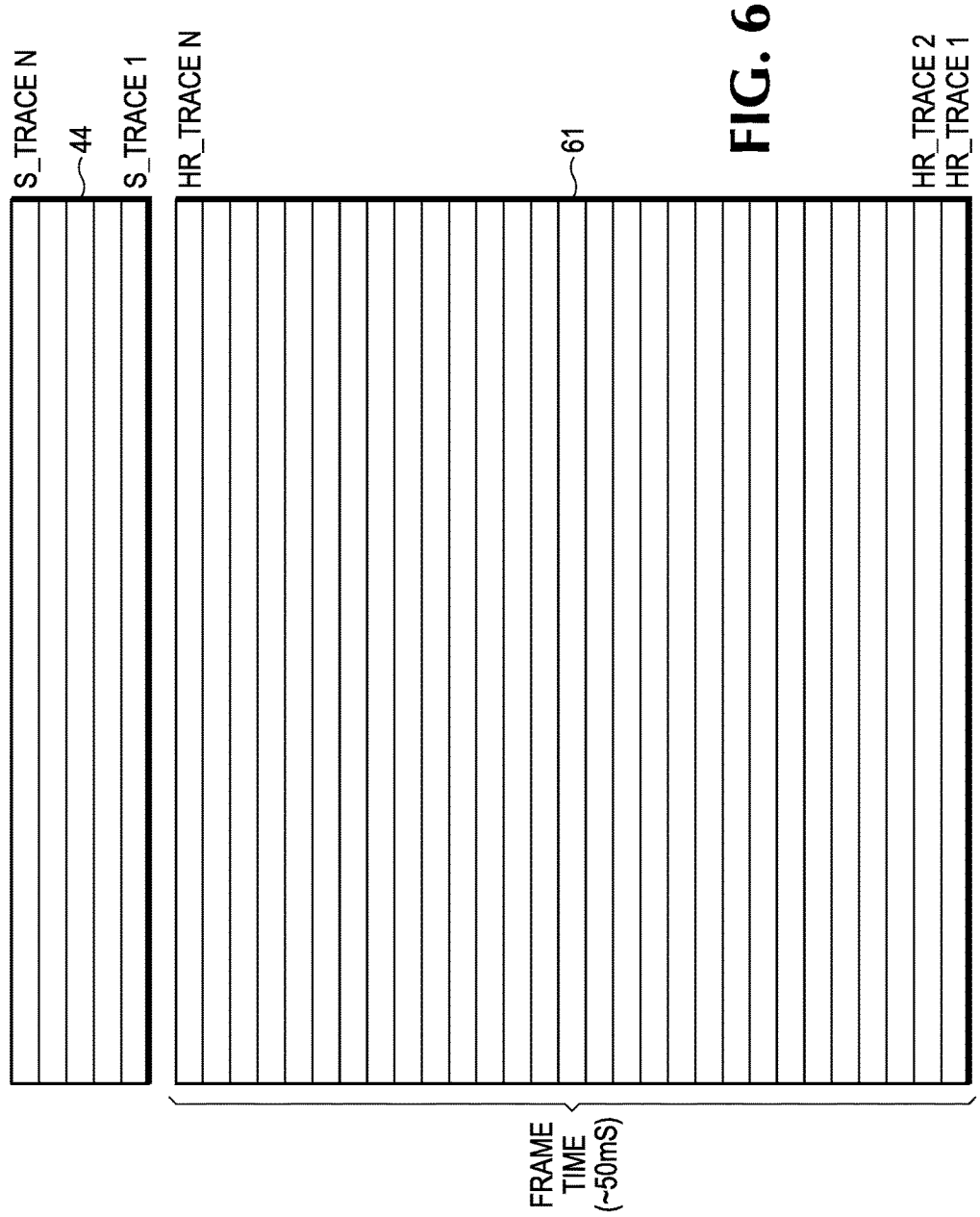
FIG. 6 is a plan view of a time domain trace storage for holding both high resolution and low resolution traces according to the present invention.

Although the realtime spectrogram display is shown in FIG. 5, FIG. 6 illustrates the result of the same processing of the time domain data to produce the timeogram display of low resolution time traces while storing high resolution time traces in the high resolution data trace store 61. When the display frame time is complete, the raster image bitmap from the raster image map memory 44 is rendered by the display device 50 for human visualization, and the HR trace store frame is saved for use in data review mode when the acquisition system is frozen. For realtime signal visualization the frame update rate for the display device 50 is preferably 20-30 frames per second to provide realtime visualization that is human discernible and to provide a realizable memory limitation for the HR trace store frame.

Figure 7:
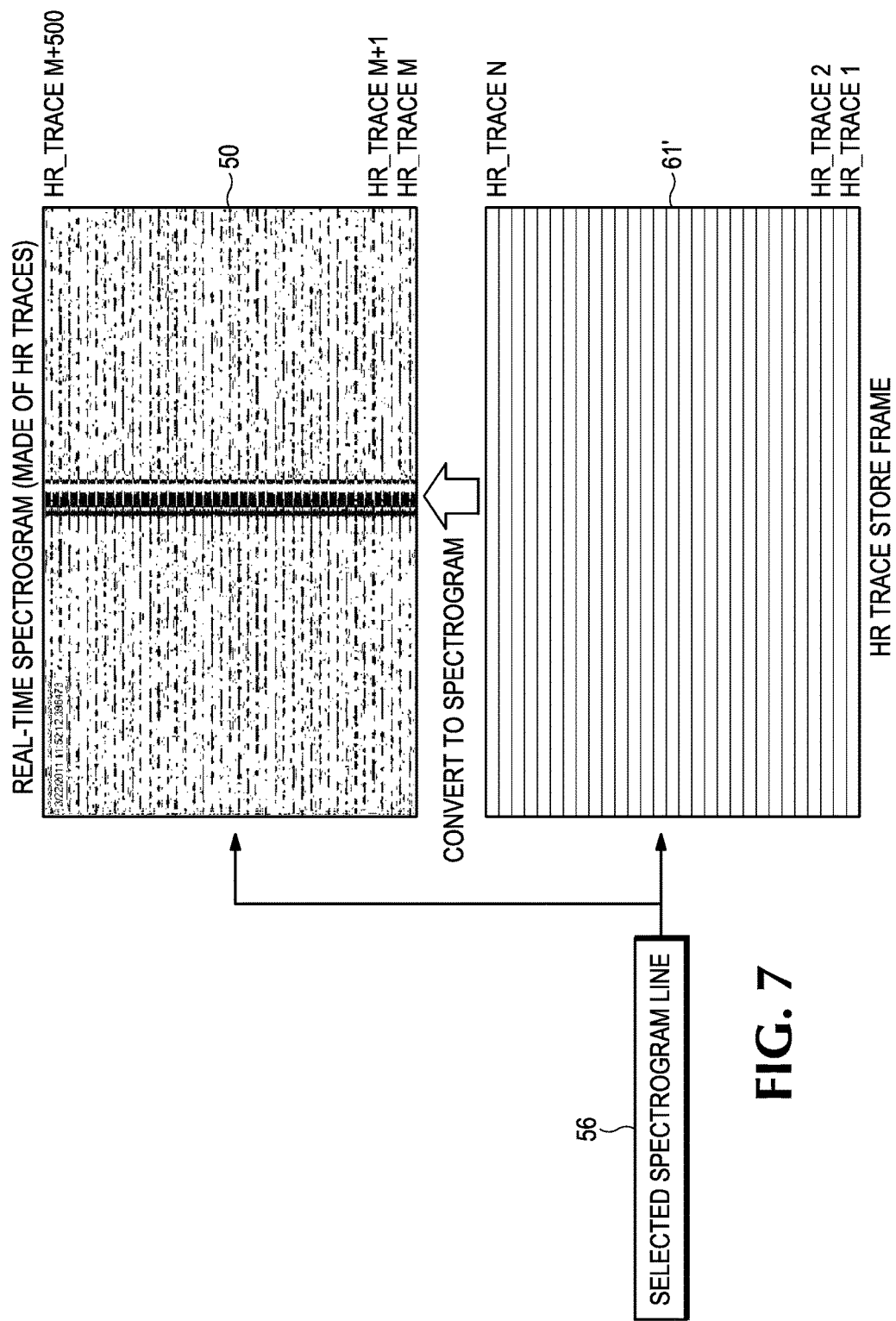
FIG. 7 is a illustrative view of providing a high resolution spectral trace display while acquisitions are frozen (data review mode) according to the present invention.

FIG. 7 illustrates the generation of a high resolution realtime spectrogram display on the display device 50 during the data review mode from the data traces in the high resolution trace store 61', as is discussed further below. For the purpose of illustration, the spectral traces that make up the spectrogram display are shown which represent only a portion of the entire high resolution trace store 61'. The user via the U/I 56 scrolls through the realtime spectrogram display which is made up of traces from the high resolution trace store 61'. The user via the U/I 56 is also able to select specific spectrum traces which are individually time-stamped with their acquisition time. Although each HR trace store frame 61 may only have a capacity of 500 lines, there may be 50,000 or more traces stored in the high resolution data trace store 61'.

To achieve realtime signal processing rates, the frequency translation and signal conditioning section 30, the display formatting section 40 and the time domain processing section 80 may be implemented in a suitable field programmable gate array (FPGA) or application specific integrated circuit (ASIC).

In spectrum analysis for cases involving spectrum monitoring, such as surveillance, transmitter performance monitoring, etc., capturing data for analysis is of high importance. This includes not only the capability for capturing seamless data records, but perhaps more importantly capturing the "right" data, i.e., the information of utmost interest in the particular monitoring application. This often requires sophisticated, real-time generation of trigger signals that can monitor signals and determine when to capture data for further analysis based on desired signal characteristics or changes in expected characteristics. Traditionally the signal characteristics monitored for determining trigger signals include power level, frequency profile (frequency mask triggers), time/frequency signature, and more recently signal density within a frequency and power range and frequency edges. Also external signals may be connected to the analysis instrument to act as trigger signals.

Figure 8:
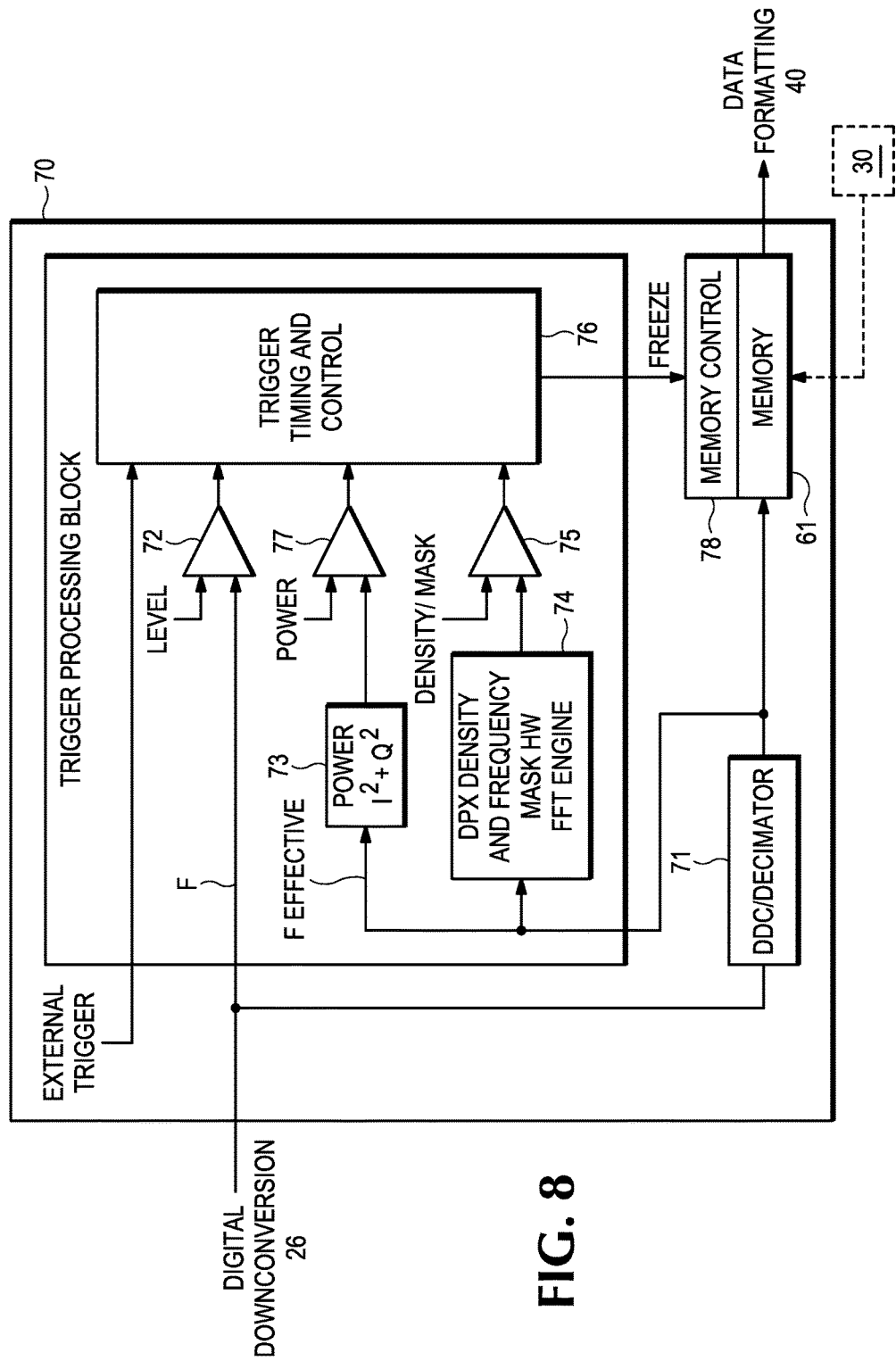
FIG. 8 is a block diagram view for generating multiple trigger signals for display in conjunction with spectrogram/timeogram displays according to the present invention.
Figure 9:
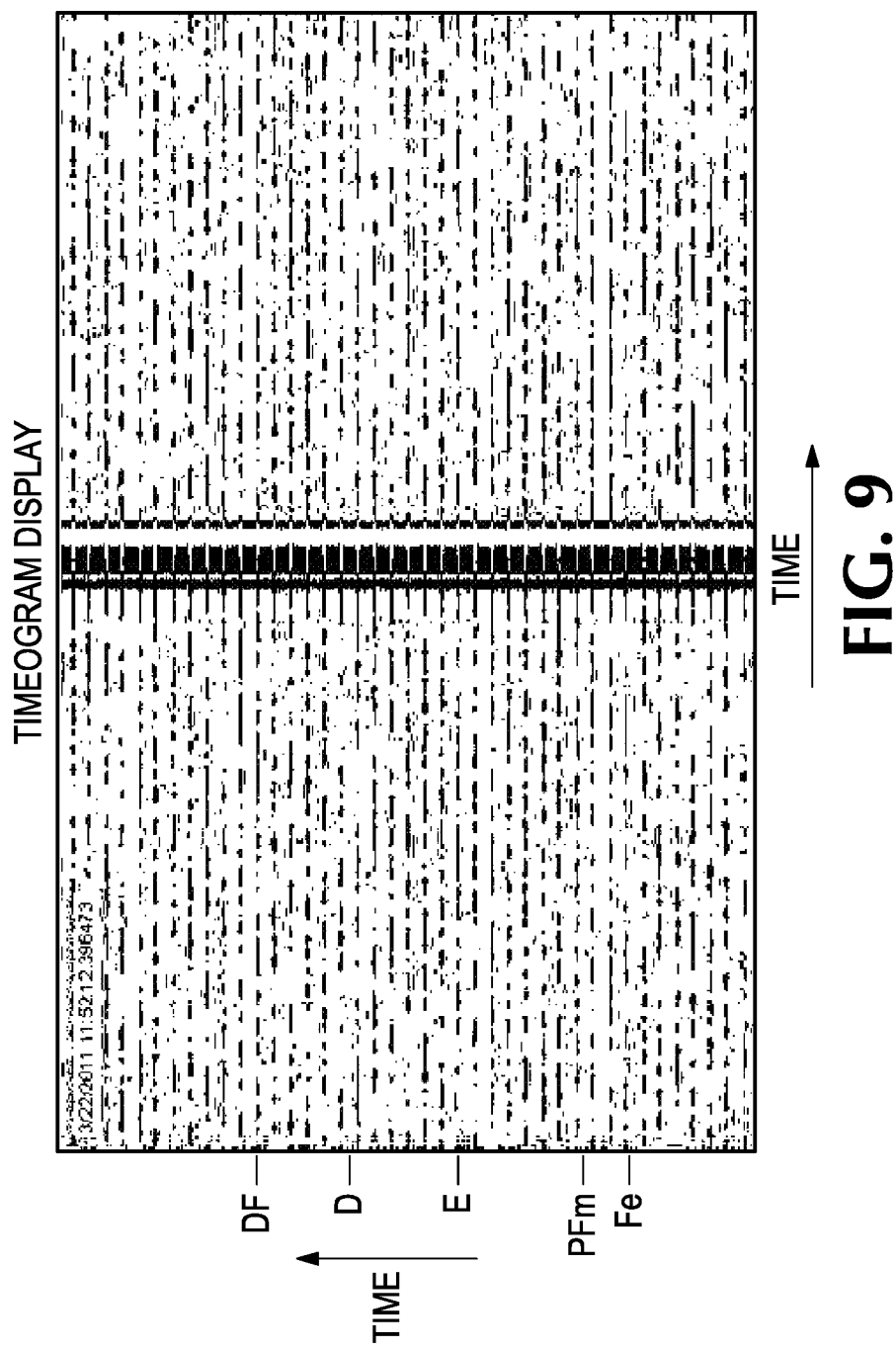
FIG. 9 is a plan view of a timeogram display including indicia of trigger events according to the present invention.

FIG. 8 shows a trigger processor 70 that receives signals from the digital down conversion block as well as an external trigger signal. The trigger processor 70 outputs a "freeze" signal to stop signal acquisitions based on parameters specified for a given trigger type, such as power, frequency mask, density, frequency edge, etc. In existing trigger processors a single trigger signal of a selected type is developed to provide the freeze signal. However, the trigger processor 70 produces a plurality of different trigger signals simultaneously. The digital time domain signal is input to a decimator 71 as the simplest form of time domain processing section 80, and to a level comparator 72. The output from the decimator 71 is input to the high resolution data trace store 61 as the high resolution traces, HR_Trace. The digital time domain signal also is input to a power calculator 73 and a density and frequency mask block 74. The outputs from the power calculator 73 and the density and frequency mask block 74 are input to respective comparators 77, 75. The outputs from the comparators 72, 75, 77 each represent a different trigger signal type, such as amplitude, power, density and frequency mask, etc. The respective trigger signals, including the external trigger signal, are input to a trigger timing and control circuit 76 where they are time-stamped and input to a memory control circuit 78. At any time determined by the user, or in response to a selected one of the types of triggers, the actual freeze trigger signal is generated to "freeze" the contents of the high resolution data trace store 61. Since the traces in the high resolution data trace store frame 61 are time-stamped, as well as the trigger events from the trigger timing and control 76, the location of the trigger events within the timeogram display, for example as shown in FIG. 9, may be also indicated as well as the type of trigger event. The location of the trigger events may also be indicated on the spectrogram display. Then the user may call up the particular data trace from either the timeogram or spectrogram display according to the associated time-stamps for further processing of the high resolution traces, since the data traces in the high resolution data trace store 61' also are time-stamped.

Thus the present invention provides gapless, real-time displays in the frequency and time domains by generating spectral and time data traces in realtime that are gapless and displayed as vertically stacked in a display frame. Trigger events may also be displayed, both as to timing and type, in the displays to provide the user with a complete, continuous RF signal visualization with high resolution as determined by user parameters, with a selected data trace in the display during an acquisition mode being displayed as high resolution data traces during a review mode.

The invention claimed is:
1. An apparatus, comprising:
   a signal acquisition section, the signal acquisition section including:
      a radio frequency (RF) input;

an RF down-converter having:
    a first variable frequency oscillator;
    a first digital mixer, the first digital mixer coupled with the RF input and the first variable frequency oscillator; and
    an intermediate frequency (IF) filter coupled with the first digital mixer;
an analog-to-digital converter (ADC) coupled with the IF filter; and
a digital down-conversion section having:
    a second variable frequency oscillator;
    a second digital mixer, the second digital mixer coupled with the ADC and the second variable frequency oscillator; and
    a bandpass filter coupled with the second digital mixer;
a frequency translation and signal conditioning section including:
    a fast frequency translation process;
    an envelope detector coupled with the fast frequency translation process; and
    a display scaling function coupled with the envelope detector; and
a display formatting section including:
    a raster state machine coupled with the display scaling function; and
    a raster map image memory coupled with the raster state machine.

2. The apparatus of claim 1, further comprising:
a display device coupled with the display formatting section.

3. The apparatus of claim 1, further comprising:
a time domain processing section coupled between the digital down-conversion section of the signal acquisition section and the frequency translation and signal conditioning section, and also coupled with the display formatting section.

4. The apparatus of claim 1, wherein the RF input is configured to receive an RF signal and provide the RF signal to the first digital mixer.

5. The apparatus of claim 3, wherein the display device is configured to receive a rasterized map image from the raster map image memory and visually present the rasterized map image to a user.

6. The apparatus of claim 4, wherein the time domain processing section is configured to receive frequency domain data from the bandpass filter, produce time domain data based on the frequency domain data, and provide the time domain data to the raster state machine.

7. The apparatus of claim 1, wherein the ADC is configured to receive an output from the IF and digitize the output to produce a digitized signal.

8. The apparatus of claim 7, wherein the second digital mixer is configured to receive a variable frequency from the second variable frequency oscillator and mix the digitized signal with the variable frequency.

9. The apparatus of claim 8, wherein the bandpass filter is configured to receive a mixed signal from the second digital mixer and produce digitized time domain data.

10. The apparatus of claim 9, wherein the fast frequency translation process is configured to produce a plurality of spectral lines from a time block of the digitized time domain data.

11. The apparatus of claim 10, wherein the envelope detector is configured to determine a signal amplitude for each of the plurality of spectral lines.

\* \* \* \* \*